United States Patent
Hsu

(10) Patent No.: US 6,815,972 B2
(45) Date of Patent: Nov. 9, 2004

(54) METHOD OF DETERMINING DISCONNECTION LOCATION IN A CIRCUIT

(75) Inventor: Hsin Chou Hsu, Hsin Tien (KR)

(73) Assignee: VIA Technologies, Inc., Hsin Tien (TW)

( * ) Notice: Subject to any disclaimer, the term of this patent is extended or adjusted under 35 U.S.C. 154(b) by 6 days.

(21) Appl. No.: 10/327,141

(22) Filed: Dec. 24, 2002

(65) Prior Publication Data

US 2004/0004492 A1 Jan. 8, 2004

(30) Foreign Application Priority Data

Jul. 2, 2002 (TW) ........................................ 91114673 A

(51) Int. Cl.[7] .............................................. G01R 31/26
(52) U.S. Cl. .................................. 324/765; 324/158.1
(58) Field of Search ........................ 324/523, 527–528, 324/532–535, 537, 642, 764–765, 158.1

(56) References Cited

U.S. PATENT DOCUMENTS

| | | | |
|---|---|---|---|
| 5,461,318 A | * | 10/1995 | Borchert et al. ............ 324/533 |
| 5,498,965 A | | 3/1996 | Mellitz |
| 5,719,503 A | * | 2/1998 | Burnett ........................ 324/534 |
| 5,877,631 A | * | 3/1999 | Takahashi .................... 324/533 |
| 6,137,293 A | | 10/2000 | Wu et al. |
| 6,420,878 B1 | * | 7/2002 | Boorom ....................... 324/533 |

FOREIGN PATENT DOCUMENTS

| | | |
|---|---|---|
| EP | 0 450 806 A2 | 10/1991 |
| GB | 2 096 856 A | 10/1982 |
| GB | 2 269 717 A | 2/1994 |

* cited by examiner

*Primary Examiner*—Minh N. Tang
(74) *Attorney, Agent, or Firm*—Birch, Stewart, Kolasch & Birch, LLP

(57) ABSTRACT

A method of determining the disconnection location in a circuit is proposed, which can determine and analyze in a nondestructive way the region of connection failure between components in a system. A time domain reflectrometer is used to measure and store a reflected waveform of a plurality of standardized failure samples. Next, a reflected waveform of an object to be tested is then measured and recorded. Finally, the reflected waveform of the object to be tested is compared with those of the samples so as to determine the disconnection location.

20 Claims, 7 Drawing Sheets

METHOD OF DETERMINING DISCONNECTION LOCATION IN A CIRCUIT

This nonprovisional application claims priority under 35 U.S.C. §119(a) on patent application No. 91114673 filed in TAIWAN on Jul. 2, 2002, which is herein incorporated by reference.

BACKGROUND OF THE INVENTION

1. Field of the Invention

The present invention relates to a method of determining the disconnection location of a circuit in an integrated circuit package and, more particularly, to a method of determining the disconnection location of a circuit in an integrated circuit package without destructing the physical structure of the integrated circuit package.

2. Description of the Prior Art

Along with the improvement of life quality and progress of science and technology, modern electronic products are made smaller and smaller to meet user's requirements. In order to meet the requirement of size reducing for these electronic products, the density of conducting wires of electronic components in electronic products is increasing and the volume of electronic components is shrinking day by day. However, the density increasing of conducting wires also increases the difficulty in the manufacturing process of these electronic components as well as the testing process thereof. Therefore, how to improve the yield of the manufacturing process to ensure that signals can be transmitted intact between components and how to find the cause when an electronic component fails have become more and more important.

When a signal transmission problem occurs in a system composed of several electronic components, it is necessary to analyze and determine which electronic component has been failed and the where the failure location is, so as to find out the problem and help the manufacturers improve their quality control of the production process. Usually, there are two categories of analysis methods: the nondestructive failure analysis method and the destructive failure analysis method. In the nondestructive failure analysis method, the external appearance check and X-ray analysis are performed. Unfortunately, in the external appearance check approach, only the external appearance of an electronic component is roughly checked, and consequently, the location regarding where disconnection occurs is comparatively difficult to be recognized, so the X-ray analysis should be further performed. The X-ray analysis, is specific and limited to some local areas, thus is not suitable when it comes to finding out the accurate location of the disconnection in a whole component. Therefore, further advanced analyses for the electronic component cannot be performed on this occasion.

In the destructive structure analysis method, the structure of an electronic component is destroyed to check whether conductive wires are failed. Although this method directly reflects the situation of the destructed region; it may also destruct some other structure-lawless regions, resulting in misjudgment of the failure position of these failure components. In addition, it is also difficult to accurately destruct a predetermined region for observation. Moreover, when destructing several uncertain regions where we are not sure if any failure occurs, much time and resources will be squandered accordingly, and hence is not a good way for the manufactures to find out the location of disconnection in an electronic component.

SUMMARY OF THE INVENTION

The primary objective of the present invention is to provide a method of determining the disconnection location through comparing waveforms, whereby performing the so-called nondestructive analysis for the connection failure between components to determine the accurate position of disconnection.

Another objective of the present invention is to provide a method of determining the disconnection location through waveforms, whereby performing an analysis for a system consisting of several components to find out the flawed disconnection location in the system.

Another objective of the present invention is to provide a method of determining the disconnection location through waveforms so as to check the internal connection problem of a single component to determine the position of disconnection in the component.

According to a preferred embodiment of the present invention, a method of determining the disconnection location in a circuit, comprising the steps of: inputting a first signal into at least one standardized failed sample of said circuit that we have already known where the disconnection location is in said sample; receiving and storing a first reflected waveform of said sample for establishing a first reflected waveform model for said sample; inputting a second signal into a device under test (DUT) of said circuit; receiving and recording a second reflected waveform of said DUT; and comparing said second reflected waveform with said first reflected waveform model to determine a disconnection location in said DUT.

Moreover, said first and second signal can be a square wave, and said first and second signal has a rising/falling time ranging from 35 to 200 pico seconds. In addition, said first reflected waveform model is stored in a picture format. Said first and second signal can be provided and received by a time domain reflectrometer (TDR). The input position of the first signal on said standardized failed sample is the same as the input position of the second signal on said DUT. The input position of said first signal to said standardized failed sample is as same as that of a reflected signal emitted therefrom. The input position of said DUT for said second signal is the same as that of a reflected signal emitted from the DUT. When the reflected waveform of said, DUT is the same as or similar to a waveform in said, first reflected waveform model, said disconnection location is determined.

Further according to a second preferred embodiment of the present invention, in the method of determining the disconnection location in a circuit, said at least one standardized failed sample of said circuit comprises a plurality of standardized failed samples and said first reflected waveform model comprises the reflected waveforms of said plurality of standardized failed samples. When the reflected waveform of said DUT is the same as or similar to a waveform in said first reflected waveform model, said disconnection location is determined. When the reflected waveform of said DUT is similar to a first waveform in said first reflected waveform model, said disconnection location can be determined by corresponding a standardized failed sample to said first waveform. When the reflected waveform of said DUT is similar to a first and a second waveform in said first reflected waveform model, said disconnection location can be determined by corresponding a first and a second standardized failed sample respectively to said first and said second waveform.

The various objects and advantages of the present invention will be more clearly understood from the following detailed description when read in conjunction with the appended drawing, in which:

DETAILED DESCRIPTION OF THE PREFERRED EMBODIMENT

Figure 1:
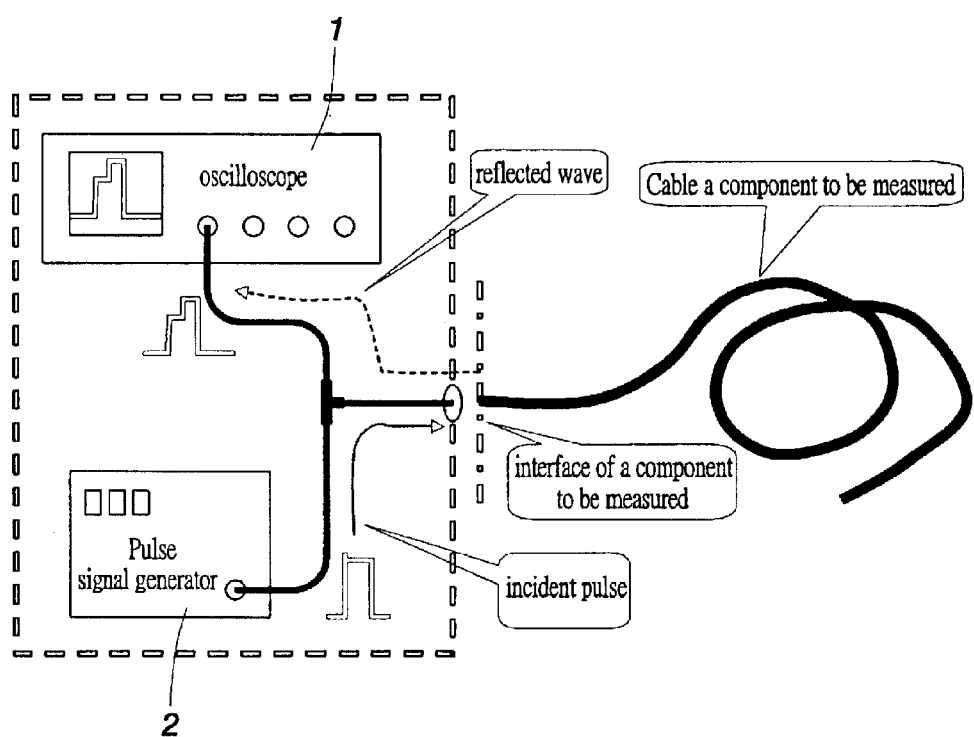
FIG. 1 is a schematic diagram illustrating the system arrangement of a time domain reflectrometer used in the present invention.

The present invention provides a method of determining the location of disconnection through waveforms from a time domain reflectrometer (TDR). As shown in FIG. 1, the system arrangement for the present invention is shown. The TDR comprises a pulse generator 2 and an oscilloscope 1. An object to be tested (or, device under test, DUT) is connected to the pulse generator 2 and the oscilloscope 1 by a conductive wire. When the test is performed, a pulse is generated by the pulse generator 2 and directed to the DUT, therefore a reflected signal emitted from the DUT is detected by the oscilloscope 1, shown on a screen thereof (not shown) in a waveform manner, and stored into a database at the same time for further use.

A waveform pattern measured from the TDR can reflect some characteristic of the physical structure of the DUT. Therefore, we can establish a reflected waveform model for some samples of which we have known the physical structure. The reflected waveform model can be established by measuring the TDR waveform of these samples. After setting up a reflected waveform model for a certain circuit by measuring the TDR waveform of some standardized failed samples of the same circuit design for the sake of recognizing where the disconnection location is, we perform the tests for some unknown failed samples (DUTs) of the that circuit by measuring the TDR reflected waveform patterns of the DUT and comparing them with those of the failure waveform model of the standardized samples, thereby determining the disconnection location of the component.

The input signal from the TDR is a square wave signal having a steep slope. More specifically, this square wave signal has a rising/falling time ranging from 35 to 200 pico seconds. The rising/falling time is negatively proportional to the resolution of the testing equipment. In other words, the shorter the rising/falling time is, the higher the resolution of the testing equipment will be, and vice versa. It is believed that a lower resolution is appropriate for a larger-scaled electronic device such as a PCB, for which a square wave signal with a rising/falling time of 200 pico seconds is applicable. Instead, for a smaller-sized electronic device like a packaged device, a higher resolution is required, and thus a square wave signal having a rising/falling time of 35 pico seconds will be used.

Figure 2:
FIG. 2 is a side view of a first type of standardized failure sample according to the present invention.
Figure 3:
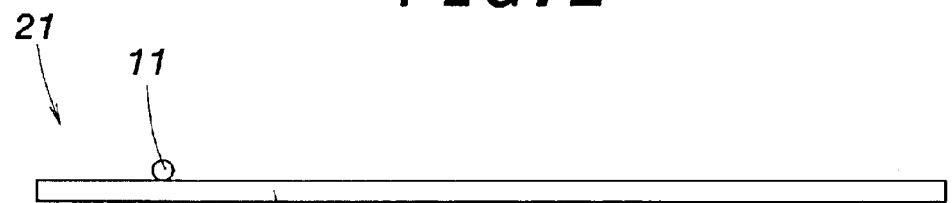
FIG. 3 is a side view of a second type of standardized failure sample according to the present invention.
Figure 4:
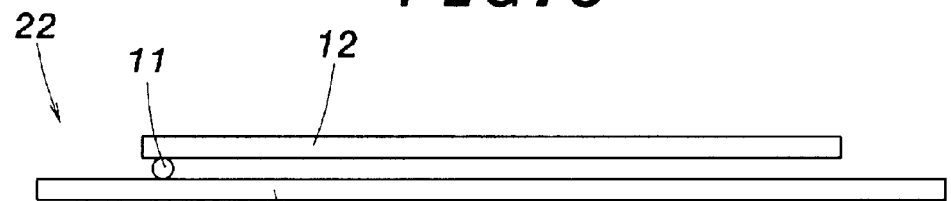
FIG. 4 is a side view of a third type standardized failure sample according to the present invention.

Therefore, TDR reflected waveform analysis can be performed for a system composed of several components, for example, a PCB including an IC package connected by solder balls, to find out a disconnection location in the system. The failed component, or even the location of disconnection in the component can be determined. As shown in FIG. 2, a printed circuit board (PCB) 10 is a first type of standardized sample 20. As shown in FIG. 3, the PCB 10 with a solder ball 11 thereon is a second type of standardized sample 21. As shown in FIG. 4, the PCB 10 having the solder ball 11 thereon and a substrate 12 soldered on the solder ball 11 is a third type of standardized sample 22. A square wave signal of a voltage of 0.5 volts and having a very short rising/falling time is emitted from the signal generator 2 of the TDR input and into a predetermined position of the conducting wire of the PCB 10 of the first type sample 20. Meanwhile, the oscilloscope 1 of the TDR receives and stores a reflected waveform pattern 10a (shown in FIG. 7) of the first type sample 20 from the position where the square wave signal is input. Reflected waveforms of the second type sample 21 and the third type sample 22 are also measured and recorded in the same way.

Figure 7:
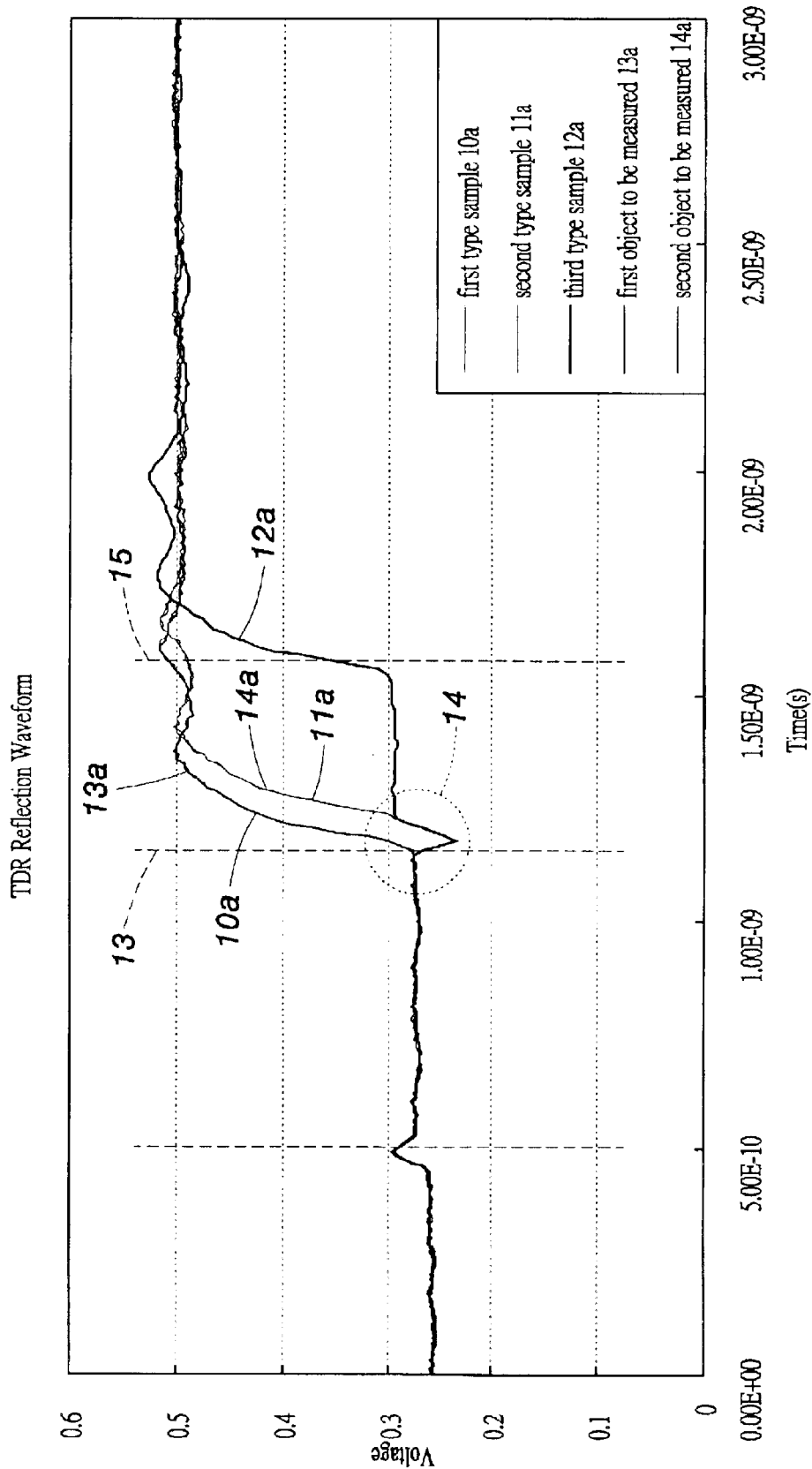
FIG. 7 is a reflected waveform diagram from the TDR for the disconnection location analysis according to the present invention.

Please refer to FIG. 7, a TDR reflected waveform diagram showing the reflected waveforms 10a, 11a, and 12a from the first sample 20, second sample 21, and third sample 22, respectively, where the vertical axis represents the voltage of the reflected signal, and the horizontal axis represents the time. In the first waveform 10a, at first, a reflected signal of 0.26 volts is received by the TDR at the, starting time represented as 0.00EXP(+00) second. Then, a small spike of about 0.3 volts occurred at 5.00EXP(−10) seconds, where a left vertical dot line is provided. After that, the waveform keeps flat at about 0.27 volts for a while until 1.20EXP(−9) seconds, where a middle vertical dot line is provided with a first marked numeral 13. Then, the waveform starts to substantially rise all the way to its peak of about 0.5 volts at 1.40EXP(−9) seconds. According to the waveform 10a, we can recognize that the left dot line corresponds to a reflected signal from the beginning of the PCB 10 and line 13 corresponds to a reflected signal from the end of the PCB 10, and after this point, the reflected signal is becoming saturated to the peak value of 0.5 volts in a short time.

In the second waveform 11a, at first, a reflected signal of 0.26 volts is received by the TDR at the starting time represented as 0.00EXP(+00) second. Then, a small spike of about 0.3 volts occurred at 5.00EXP(−10) seconds, where a left vertical dot line is provided. After that, the waveform keeps flat at about 0.27 volts for a while until 1.20EXP(−9) seconds, where the first marked line 13 is provided. Before the first marked line 13, the second waveform 11a is very similar to or substantially equal to the first waveform 10a (please refer to FIG. 7 for the substantially equal case). After marked line 13, a negative spike 14, of about 0.24 volts occurs on the waveform 11a. Then the waveform 11a is a little staggered at about 0.3 volts at 1.25EXP(−9) seconds and then immediately starts to substantially rise all the way to its peak of about 0.5 volts at 1.45EXP(−9) seconds. According to the waveform 11a, we can recognize that the left dot line corresponds to a reflected signal from the beginning of the PCB 10 and marked line 13 corresponds to a reflected signal from the end of the PCB 10. The negative spike 14 indicates the setting of the solder ball 11, which has a capacitance effect to the circuit system, and thus lowers the voltage of the reflected signal. The time of about 1.25EXP(−9) seconds corresponds to the end of the solder ball 11, and after this point, the reflected signal is becoming saturated to the peak value of 0.5 volts in a short time.

In the third waveform 12a, at first, a reflected signal of 0.26 volts is received by the TDR at the starting time represented as 0.00EXP(+00) second. Then, a small spike of about 0.3 volts occurred at 5.00EXP(−10) seconds, where a left vertical dot line is provided. After that, the waveform keeps flat at about 0.27 volts for a while until 1.20EXP(−9) seconds, where the first marked line 13 is provided. After marked line 13, the negative spike 14 of about 0.24 volts occurs and the reflected signal goes up to about 0.3 volts at about 1.25EXP(−9) seconds and keeps flat at about 0.3 volts for a while until 1.60EXP(−9) seconds, where a right vertical dot line is provided with a second marked numeral 15. Then, the waveform starts to substantially rise all the way to its peak of about 0.52 volts at about 1.80EXP(−9) seconds. Before the first mark 14, the third waveform 12a is very similar to or almost substantially equal to the second waveform 11a (please refer to FIG. 7 for the substantially equal case). According to the waveform 12a, we can recognize that the left dot line corresponds to a reflected signal from the beginning of the PCB 10 and marked line 13 corresponds to a reflected signal from the end of the PCB 10. The negative spike 14 indicates the location of the solder ball 11, which has a capacitance effect to the circuit system, and thus lowers the voltage of the reflected signal. After the negative spike 14 at 1.25EXP(−9) seconds and before the second marked line 15, the flat waveform portion of 0.3 volts corresponds to the substrate 12 of the package. The second marked line 15 indicates the end of the substrate 12 and the reflected signal is becoming saturated to the peak value of 0.5 volts in a short time.

Figure 5:
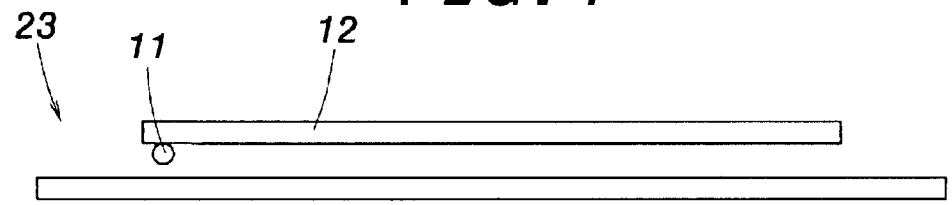
FIG. 5 is a side view of a first DUT according to the present invention.

In addition, as shown in FIG. 7, a reflected waveform of a first object to be tested (device under test, DUT) 23 is measured and stored according to the above procedures. It can be found that the reflected waveform 10a of the first type sample 20 overlaps the reflected waveform 13a of the first DUT 23. And, thus the first DUT 23 has only the reflected wave for the PCB 10, and it can be determined that there is a disconnection occurred between the solder ball 11 and the PCB 10 of the first DUT 23, as shown in FIG. 5. It is easy to understand that according to the micro-structure observation and analysis illustrated in FIG. 5, wherein the solder ball 11 of the DUT 23 is not soldered onto the PCB 10, the structure is similar to or almost the same as that of the first type of sample 20 shown in FIG. 2, and therefore, the waveform pattern of the first DUT 23 should be similar to or almost the same as that of the first type of sample 20.

Figure 6:
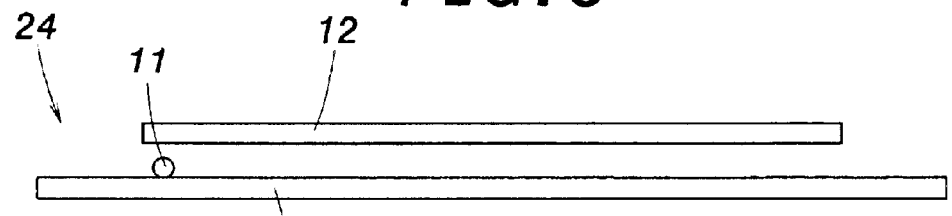
FIG. 6 is a side view of a second DUT according to the present invention.

Moreover, a TDR reflected waveform pattern 14a of a second DUT 24 is tested and recorded in FIG. 7. One can find that the reflected waveform 11a of the second type sample 21 overlaps the reflected waveform 14a of the second DUT 24. We can determine that there is a disconnection between the solder ball 11 and the substrate 12 of the package. This can be understood by the fact that when the waveform pattern looks like the second type of sample 21, there only the PCB 10 and the solder ball have been detected successfully. So, there must be a disconnection in the second DUT 24 such that for the electrical signal, the micro structure of the second DUT 24 is similar to or almost the same as the second type of sample 21. Therefore, the only possible disconnection location is between the solder ball 11 and the package substrate 12, as shown in FIG. 6.

According to the analysis above, one can determine where the disconnection or failure is from a component perspective by comparing the DUT with the TDR reflected waveform model established based on some known standardized failure sample circuits of the same design. Through the method, one can even further determine the location of the disconnection in certain kinds of components, and further detailed explanation will be provided hereinafter.

Figure 8:
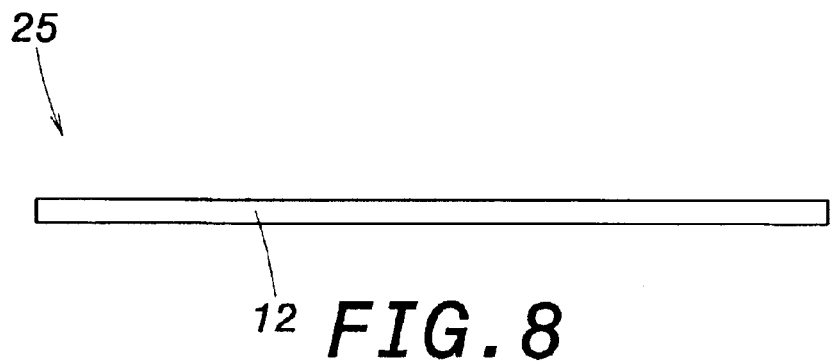
FIG. 8 is a side view of a fourth type of standardized failure sample according to the present invention.
Figure 9:
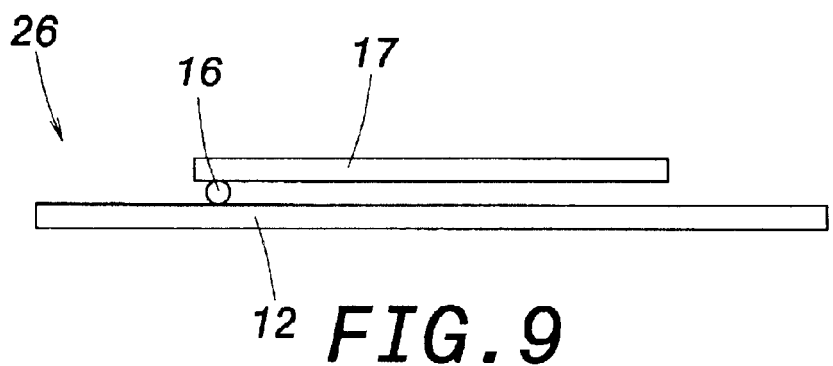
FIG. 9 is a side view of a fifth type of standardized failure sample according to the present invention.
Figure 11:
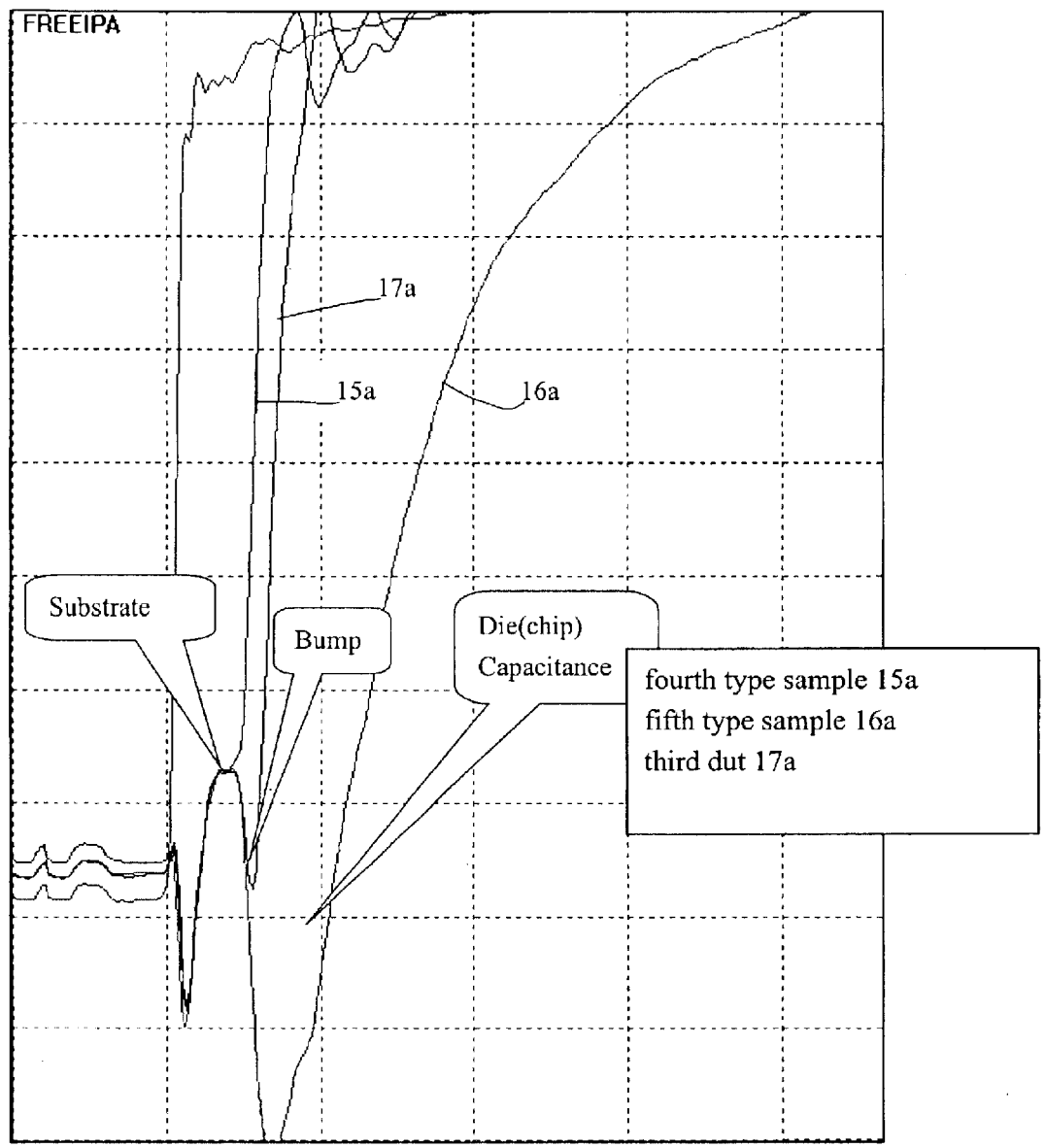
FIG. 11 is a reflected waveform diagram from the TDR for a single component analysis according to the present invention.
Figure 12:
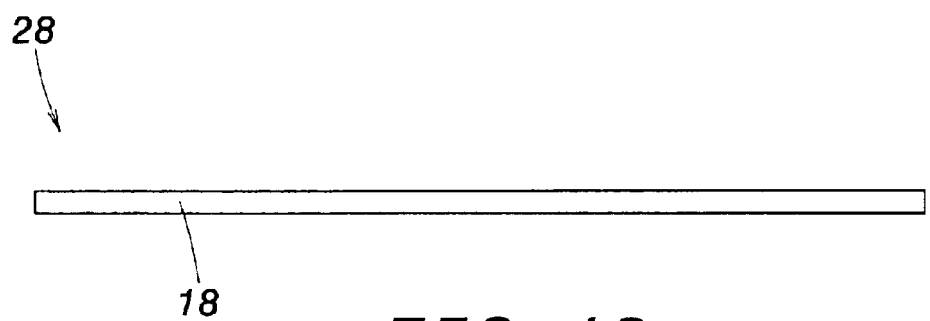
FIG. 12 is a side view of a sixth type of standardized failure sample according to the present invention.

In another embodiment of the present invention, the interconnection problem in a single component, such as an IC package comprising a substrate 12, a flip chip bump 16 connecting a chip 17 on the substrate 12, is going to be checked. Auxiliary fixture (not shown) can be used to attach the testing conductive wires of the TDR to the IC package. As shown in FIG. 8, a substrate 12 of the package is a fourth type of standardized sample 25. As shown in FIG. 9, the substrate 12 with a flip chip bump 16 soldered thereon and further with a chip 17 soldered on the flip chip bump 16 is a fifth type of standardized sample 26. The TDR reflected waveforms of the standardized samples 25 and 26 are tested, recorded and shown in FIG. 11 as waveforms 15a and 16a, respectively. As can be seen in FIG. 11, the waveform 15a for the fourth sample 25 rises from a negative spike and staggers for a short while and then goes up with a steep slope. The staggering on the waveform 15a indicates the existence of the substrate 12 and the fact that the signal is becoming saturated after this point. The waveform 16a, compared with the waveform 15a, goes down significantly after the time point indicative of the location of the substrate 12 and then starts to climb up later from a very low position. The great descending portion of waveform 16a indicates the existence of a large capacitance effect of the chip 17.

Figure 10:
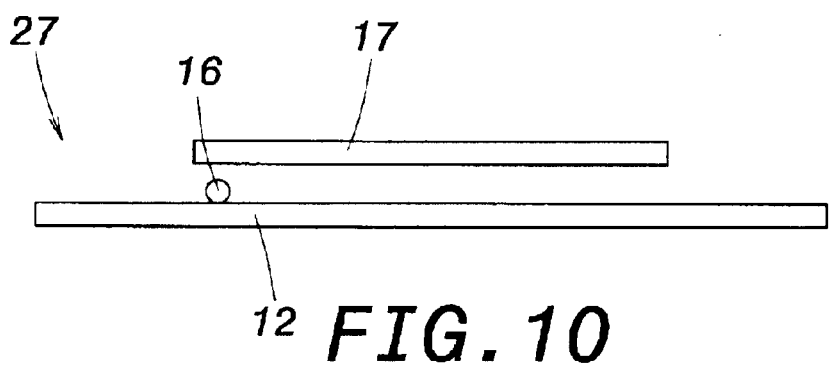
FIG. 10 is a side view of a third DUT according to the present invention.

The third DUT 27 is of the same circuit design but failed in functionality. As can be seen in FIG. 11, the waveform 17a goes down a little after the time point representing the location of the substrate 12 and then starts to climb up immediately in a steep slope. It can found that in the waveform 17a, the reflected signal of substrate 12 can be seen, while the reflected signal of the chip 17 disappears. So, we can figure out the chip 17 of the third DUT 27 is not connected to the substrate 12. As to the descending portion of waveform 17a right after the time point indicative of the location of the substrate 12 can be recognized as the existence the little capacitance effect of the flip chip bump 16. In addition, the steep rising portion of the waveform 15a and 17a are similar, but that of the waveform 17a is with a little delay. This consequence can be explained as the saturation in waveform 17a occurs later, and thus the length thereof is longer than that of the waveform 15a, therefore complying with the viewpoint that the flip chip bump 16 is observed on the waveform 17. Consequently, there is a disconnection of the third DUT 27 between the flip chip bump 16 and the chip 17, as shown in FIG. 10.

Figure 13:
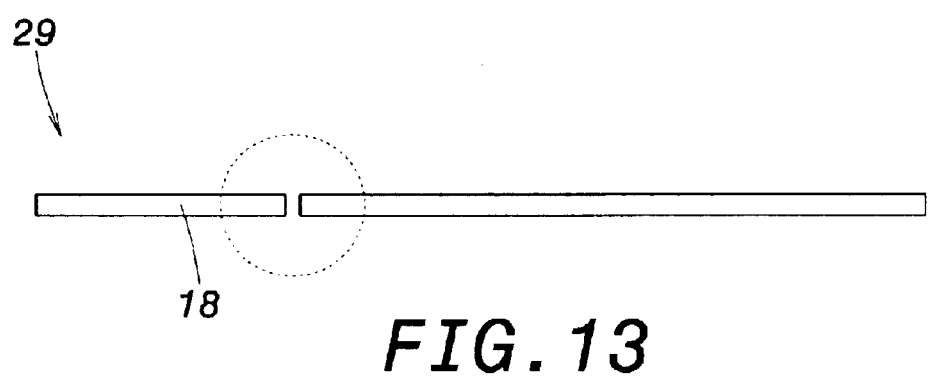
FIG. 13 is a side view of a fourth DUT according to the present invention.
Figure 14:
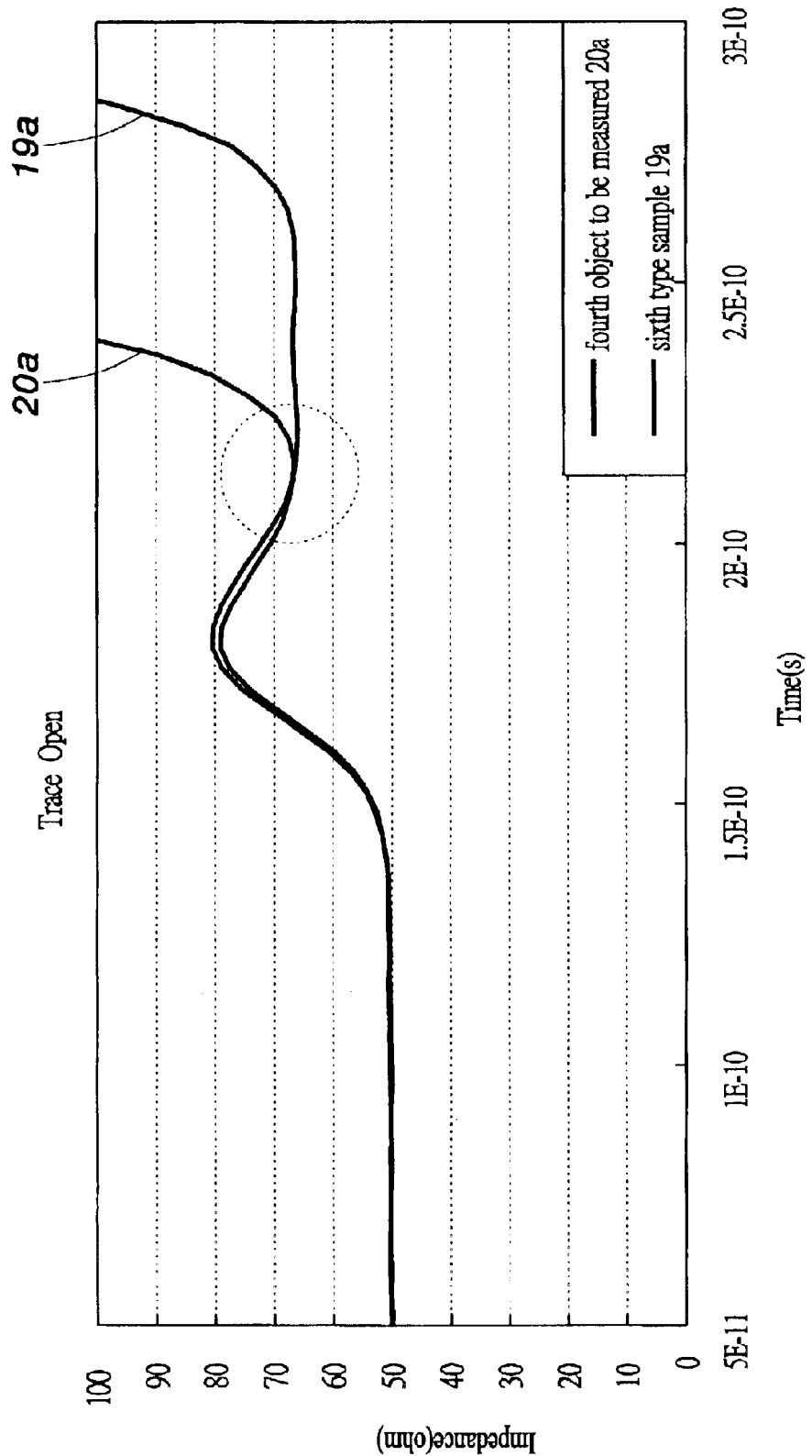
FIG. 14 is a reflected waveform diagram from the TDR for checking the connection of the conducting wires according to the present invention.

Moreover, the present invention can further check whether a conducting wire is OK. The TDR provides a square wave having a steep slope into a normal conducting wire 18 of a sixth type sample 28, and a reflected waveform model 19a of the sixth type sample 28 is received and stored to establish a reflected waveform model for the normal conducting wire 18, which serves as a standardized sample. Further, a second reflected waveform 20a of a conducting wire 18 of a fourth DUT 29 (shown in FIG. 13) is measured by the TDR. Because the second reflected waveform 20a of the fourth DUT 29 does not completely overlap the first reflected waveform model 19a of the sixth type sample, and starts to substantially rise early, one can determine that the fourth DUT 29 is broken conducting wire 18. This conforms with the same conclusion that the conducting wire 18 of the fourth object to be measured 29 shown in FIG. 13 is broken.

Since the pulse signal is input from pulse generator 2 and reflected back by the circuit of the DUT to the oscilloscope 1, the traveling distance for the reflected signal shown on the oscilloscope 1 is doubled. Therefore, the distance corresponds to the time interval between the left dot line and the line 13 is twice as much as the whole length of the PCB 12. The same situation occurs to any signal reflected from the DUT and received by the oscilloscope 1. Therefore, two points on the reflected waveform corresponds to twice the distance between the two points. In addition, since we can get the transmission speed of the signal wave in a specific conductive structure, we can calculate the distance between the two points. The transmission speed of an electrical signal wave in a specific conductive structure can be determined by measurement or calculation through theory. Hence, for a certain circuit system, in case that the TDR pulse resolution is suitable, we can use the time shown on the waveform and the transmission speed of the signal to determine the location of a disconnection.

The method of determining the disconnection location through waveforms of the present invention includes the following steps:
A. Input a square wave having a steep slope, which is provided by the TDR, into a predetermined position of at least one standardized sample. A first reflected waveform of the sample is received from the same predetermined position and stored, thereby establishing a reflected waveform model for the sample.
B. Input the same square wave having a steep slope into the predetermined position of an object to be measured (DUT). A second reflected waveform of the DUT is then received and recorded at the same predetermined position.
C. The second reflected waveform of the object to be measured is compared with the reflected waveform model for the standardized samples to determine the disconnection location.

To sum up, through the present invention, one can find the disconnection location of in a system containing several connected components without destructing them. Single component or local analysis within the system can then be further performed to determine the exact position of disconnection. The failure problem in a package component can thus be easily analyzed, hence allowing manufacturers to figure out the problem manufacturing more readily.

Although the present invention has been described with reference to the preferred embodiment thereof, it will be understood that the invention is not limited to the details thereof. Various substitutions, modifications sand equivalents can be made by those of ordinary skills in the art without departure from the spirits. Therefore, all such substitutions, modifications and equivalents are intended to be embraced within the scope of the invention as defined in the appended claims.

I claim:
1. A method for determining disconnection locations of a device under test (DUT) according to a sample device, comprising:
inputting a first signal into the sample device;
receiving a first reflected waveform of the sample device;
inputting a second signal into the DUT;
receiving a second reflected waveform of the DUT; and
comparing the first reflected waveform and the second reflected waveform to determine where the disconnection location of the DUT is.
2. The method of claim 1, where in the first signal is a square wave, provided by a time domain reflectrometer (TDR).
3. The method of claim 1, wherein the second signal is a square wave provided by a time domain reflectrometer (TDR).
4. The method of claim 1, wherein the first signal has a rising/falling time ranging from 35 to 200 pico seconds.
5. The method of claim 1, wherein the second signal has a rising/falling time ranging from 35 to 200 pico seconds.
6. The method of claim 1, wherein the sample device has a known disconnection location, and if the second reflected waveform is substantially the same as the first reflected waveform, the DUT also has the same disconnection location.
7. The method of claim 1, wherein the sample device has a plurality of known disconnection locations, and if the second reflected waveform is substantially the same as the first reflected waveform, the DUT also has the same disconnection locations.
8. The method of claim 1, wherein the sample device and the DUT have the same structure.
9. The method of claim 1, wherein the sample device and the DUT are electronic devices or circuits.
10. A method for determining disconnection locations of a device under test (DUT) according to a plurality of sample devices, comprising:
deriving a plurality of default reflected waveforms from the plurality of sample devices which respectively have at least one disconnection location in different regions;
choosing one default reflected waveform from the plurality of default reflected waveforms;
deriving an object reflected waveform from the DUT;
comparing the chosen default reflected waveform and the object reflected waveform to determine the disconnection location of the DUT.
11. The method of claim 10, further comprising: inputting a first signal into the plurality of sample devices to respectively receive the plurality of corresponding default reflected waveforms.
12. The method of claim 11, wherein the first signal is a square wave, provided by a time domain reflectrometer (TDR).
13. The method of claim 11, wherein the first signal has a rising/falling time ranging from 35 to 200 pico seconds.
14. The method of claim 10, further comprising: inputting a second signal into the DUT to receive the object reflected waveform.
15. The method of claim 14, wherein the second signal is a square wave provided by a time domain reflectrometer (TDR).
16. The method of claim 14, wherein the second signal has a rising/falling, time ranging from 35 to 200 pico seconds.
17. The method of claim 10, wherein each of the sample devices has a known disconnection location, and if the object reflected waveform is substantially the same as the corresponding reflected waveform of the sample device, the DUT also has the same disconnection location as one of the sample devices.

18. The method of claim 10, wherein each of the sample devices has a plurality of known disconnection locations, and if the object reflected waveform is substantially the same as the corresponding reflected waveform of the sample device, the DUT also has the same disconnection locations as one of the sample devices.

19. The method of claim 10, wherein the sample device and the DUT have the same structure.

20. The method of claim 10, wherein the sample device and the DUT are electronic devices or circuits.

* * * * *